United States Patent
Xie

(10) Patent No.: US 10,297,424 B2
(45) Date of Patent: May 21, 2019

(54) FILAMENT, IONIZATION CHAMBER, AND ION-IMPLANTATION APPARATUS

(71) Applicant: Wuhan China Star Optoelectronics Semiconductor Display Technology Co., Ltd., Wuhan, Hubei (CN)

(72) Inventor: Rui Xie, Guangdong (CN)

(73) Assignee: Wuhan China Star Optoelectronics Semiconductor Display Technology Co., Ltd., Wuhan, Hubei (CN)

( * ) Notice: Subject to any disclaimer, the term of this patent is extended or adjusted under 35 U.S.C. 154(b) by 0 days.

(21) Appl. No.: 15/562,416

(22) PCT Filed: Jul. 26, 2017

(86) PCT No.: PCT/CN2017/094414
§ 371 (c)(1),
(2) Date: Sep. 27, 2017

(87) PCT Pub. No.: WO2019/000533
PCT Pub. Date: Jan. 3, 2019

(65) Prior Publication Data
US 2018/0374683 A1    Dec. 27, 2018

(51) Int. Cl.
*H01J 37/32* (2006.01)
*H01J 37/317* (2006.01)

(52) U.S. Cl.
CPC .... *H01J 37/32541* (2013.01); *H01J 37/3255* (2013.01); *H01J 37/3171* (2013.01); *H01J 2237/082* (2013.01)

(58) Field of Classification Search
CPC ............. H01J 37/32541; H01J 37/3255; H01J 37/3171; H01J 2237/082
(Continued)

(56) References Cited

U.S. PATENT DOCUMENTS

| 5,856,674 A | 1/1999 | Kellerman |
| 8,895,115 B2 * | 11/2014 | Gorokhovsky ..... C23C 14/0641 |
| | | 427/299 |
| 2015/0340194 A1 * | 11/2015 | Sato ........................ H01J 37/06 |
| | | 250/426 |

FOREIGN PATENT DOCUMENTS

| CN | 202172061 U | 3/2012 |
| CN | 103887132 A | 6/2014 |

(Continued)

*Primary Examiner* — Nicole M Ippolito
*Assistant Examiner* — Hanway Chang
(74) *Attorney, Agent, or Firm* — Andrew C. Cheng

(57) ABSTRACT

A filament includes first and second end portions between which a connecting portion is arranged. The first and second end portions are electrically connected to a power supply device. The first end portion is bent with respect to the second end portion through the connecting portion. A cross-sectional dimension of the bent connecting portion is the same as cross-sectional dimensions of the first and second end portions. Also disclosed are an ionization chamber and an ion-implantation apparatus. The cross-sectional dimension of the filament is uniform. The resistance of respective portions of the filament is the same. The number of the hot electrons generated at respective portions by powering the filament is the same. The hot electrons and ion-source gas collide to generated plasma. The plasma concentration around the filament is uniform, to avoid the emergence of corrosion of the filament at certain portion caused by an over high plasma concentration.

20 Claims, 5 Drawing Sheets

(58) Field of Classification Search
USPC .......................... 250/432 R, 423 R, 424, 428
See application file for complete search history.

(56) References Cited

FOREIGN PATENT DOCUMENTS

| | | |
|---|---|---|
| JP | 2006216440 A | 8/2006 |
| JP | 2010287415 A | 12/2010 |
| TW | 200520034 A | 6/2005 |
| WO | 02082489 A3 | 3/2003 |

* cited by examiner

FILAMENT, IONIZATION CHAMBER, AND ION-IMPLANTATION APPARATUS

CROSS-REFERENCE TO RELATED APPLICATIONS

The present application claims the priority benefit of application serial No. 201710495834.8, entitled "Filament, ionization chamber, and ion-implantation apparatus", filed on Jun. 26, 2017, which is incorporated herein by reference for all purposes and fully set forth herein.

BACKGROUND OF THE APPLICATION

Field of Application

The present application relates to the field of liquid crystal display, and more particularly to a filament, ionization chamber, and ion-implantation apparatus.

Description of Prior Art

Display devices have become an indispensable part of modern life. In the process of low temperature polysilicon (LTPS) thin film transistors and organic light-emitting diodes (OLEDs) for display devices, the ion-implantation apparatus is needed to implant the plasma into the glass substrate. In the ion-implantation apparatus, the ion-source gas evenly enters in the ionization chamber through the air supply pipe, the filament of the ionization chamber filament generates hot electrons after supplying with current, the hot electrons and ion-source gas collide to each other to generate plasma.

In the conventional art, the filament in the ion-implantation apparatus needs to be bent several times to form a specific shape, so the filament has a smaller cross-sectional area at the bend points, causing the resistance of the bending points of the filament be larger than other portions which are un-bent. Hot electrons are generated after applying with current, the ion-source gas into ionization chamber collides the hot electrons to produce plasma, due to the portions of the filament which has larger resistance will produce more hot electrons, the more thermal electrons collide the ion-source gas to produce more plasma, resulting the plasma concentration around the bending points of the filament be higher, the plasma concentration near the filament is not uniform. The higher plasma concentration is easier to corrode the filament, so that the filament is more likely to break around the bending points after a long time usage, the filament life is shortened, the maintenance costs of ion-implantation apparatus and display equipment production costs is increased.

SUMMARY OF THE APPLICATION

In order to solve the technical problem, the present application provides a filament, an ionization chamber and an ion-implantation apparatus for solving the problem that: for the filament of the prior art is more likely to break around the bending point after a long time usage, the life time of the filament is short and the maintenance cost of the ion-implantation apparatus and the production cost of the display device are high.

A filament, applying to an ion implantation apparatus. The filament comprises a first end portion, a second end portion, and a connecting portion between the first end portion and the second end portion. The first end portion and the second end portion are electrically connected to a power supply device. The first end portion is bent with respect to the second end portion through the connecting portion. A cross-sectional dimension of the bent connecting portion is the same as cross-sectional dimensions of the first end portion and the second end portion.

Wherein, the connecting portion comprises a main body portion and a protrusion portion. The main body portion is connected between the first end portion and the second end portion. A cross-sectional dimension of the main body portion is the same as the cross-sectional dimensions of the first end portion and the second end portion. The protrusion portion is protruded from a surface of the main body portion in a direction of the cross-sectional dimension. A cross-sectional dimension of the connecting portion before bending is larger than the cross-sectional dimensions of the first end portion and the second end portion. The cross-sectional dimension of the connecting portion after bending is equal to the cross-sectional dimensions of the first end portion and the second end portion.

Wherein the protrusion portion comprises a first end, a second end, and a third end between the first end and the second end. The first end is protruded at one end from the main body portion connecting to the one end of the first end portion. The second end is protruded at one end of the main body portion connecting to the second end portion. The cross-sectional dimensions of the first end to the third end and the cross-sectional dimensions of the second end to the third end are uniformly increased before bending. The cross-sectional dimension of the connecting portion is uniform after bending.

Wherein a curvature of the connecting portion after bending is not less than $\pi$. A distance between the first end portion and the second end portion is not greater than a bending diameter of the connecting portion.

Wherein the first end portion, the connecting portion, and the second end portion are successively connected to form a bending unit. The filament comprises a plurality of filament units. The first end portion of each of the filament units is fixedly connected with the second end portion of an adjacent filament unit. The second end portion of each of the filament units is fixedly connected with the first end portion of an adjacent filament unit.

Wherein the connecting portions of adjacent two filament units are bent in opposite directions.

Wherein the first end portion, the second end portion, and the connecting portion are integrally molded.

Wherein the filament is a tungsten wire.

An ionization chamber is applying to an ion implantation apparatus. The ionization chamber comprises a cavity, air supply tubes, and filaments. The air supply tubes and the filaments are disposed in the cavity. The filaments are energized to generate hot electrons for outputting an ion-source gas. The ion-source gas collides with the hot electrons to produce plasma. Each of the filaments comprises a first end portion, a second end portion, and a connecting portion between the first end portion and the second end portion. The first end portion and the second end portion are electrically connected to a power supply device. The first end portion is bent with respect to the second end portion through the connecting portion. A cross-sectional dimension of the bent connecting portion is the same as cross-sectional dimensions of the first end portion and the second end portion.

Wherein, the connecting portion comprises a main body portion and a protrusion portion. The main body portion is connected between the first end portion and the second end portion. A cross-sectional dimension of the main body portion is the same as the cross-sectional dimensions of the first end portion and the second end portion. The protrusion portion is protruded from a surface of the main body portion in a direction of the cross-sectional dimension. A cross-sectional dimension of the connecting portion before bending is larger than the cross-sectional dimensions of the first end portion and the second end portion. The cross-sectional dimension of the connecting portion after bending is equal to the cross-sectional dimensions of the first end portion and the second end portion.

Wherein the protrusion portion comprises a first end, a second end, and a third end between the first end and the second end. The first end is protruded at one end from the main body portion connecting to the one end of the first end portion. The second end is protruded at one end of the main body portion connecting to the second end portion. The cross-sectional dimensions of the first end to the third end and the cross-sectional dimensions of the second end to the third end are uniformly increased before bending. The cross-sectional dimension of the connecting portion is uniform after bending.

Wherein a curvature of the connecting portion after bending is not less than π. A distance between the first end portion and the second end portion is not greater than a bending diameter of the connecting portion.

Wherein the first end portion, the connecting portion, and the second end portion are successively connected to form a bending unit. The filament comprises a plurality of filament units. The first end portion of each of the filament units is fixedly connected with the second end portion of an adjacent filament unit. The second end portion of each of the filament units is fixedly connected with the first end portion of an adjacent filament unit.

Wherein the connecting portions of adjacent two filament units are bent in opposite directions.

Wherein the first end portion, the second end portion, and the connecting portion are integrally molded.

Wherein the filament is a tungsten wire.

An ion implantation apparatus, wherein the ion implantation apparatus comprises filaments. Each of the filaments comprises a first end portion, a second end portion, and a connecting portion between the first end portion and the second end portion. The first end portion and the second end portion are electrically connected to a power supply device; the first end portion is bent with respect to the second end portion through the connecting portion. A cross-sectional dimension of the bent connecting portion is the same as cross-sectional dimensions of the first end portion and the second end portion.

Wherein, the connecting portion comprises a main body portion and a protrusion portion. The main body portion is connected between the first end portion and the second end portion. A cross-sectional dimension of the main body portion is the same as the cross-sectional dimensions of the first end portion and the second end portion. The protrusion portion is protruded from a surface of the main body portion in a direction of the cross-sectional dimension. A cross-sectional dimension of the connecting portion before bending is larger than the cross-sectional dimensions of the first end portion and the second end portion. The cross-sectional dimension of the connecting portion after bending is equal to the cross-sectional dimensions of the first end portion and the second end portion.

Wherein the protrusion portion comprises a first end, a second end, and a third end between the first end and the second end. The first end is protruded at one end from the main body portion connecting to the one end of the first end portion. The second end is protruded at one end of the main body portion connecting to the second end portion. The cross-sectional dimensions of the first end to the third end and the cross-sectional dimensions of the second end to the third end are uniformly increased before bending. The cross-sectional dimension of the connecting portion is uniform after bending.

Wherein a curvature of the connecting portion after bending is not less than π. A distance between the first end portion and the second end portion is not greater than a bending diameter of the connecting portion.

The beneficial effects of the present application are: the connecting portion is a bent portion of the filament, and the cross-sectional dimensions of the respective portions (the first end portion, the second end portion and the connecting portion) after the filament is bent are the same. Because the resistance of the filament is related with the cross-sectional dimension of the filament, the cross-sectional dimension of the filament is uniform, the resistance of respective portions of the filament is the same, the number of the hot electrons generated at respective portions by powering the filament is the same, the hot electrons and ion-source gas collide to generated plasma, the plasma concentration around the filament is uniform, to avoid the emergence of corrosion of the filament at certain portion caused by an over high plasma concentration, hence, the filament is not easy to break, the filament life is improved, the ion-implantation apparatus maintenance costs and display equipment production costs are reduced.

BRIEF DESCRIPTION OF THE DRAWINGS

In order to more clearly illustrate the embodiments of the present application or the technical solutions in the conventional art, the following drawings, which are to be used in the description of the embodiments or the conventional art, will be briefly described. It will be apparent that the drawings in the following description are some embodiments of the present application, and other drawings may be obtained by those skilled in the art without departing from the inventive work.

DETAILED DESCRIPTION OF THE PREFERRED EMBODIMENTS

Figure 1:
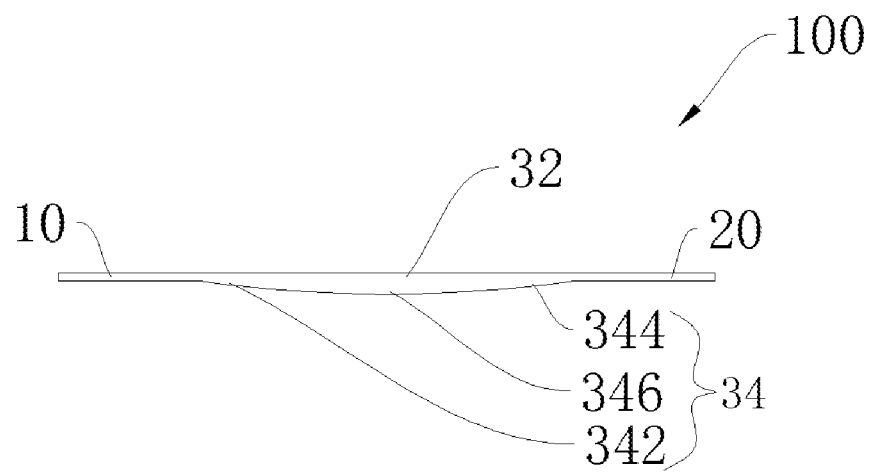
FIGS. 1, 2, and 3 are schematic views showing the structure of the filament before bending according to the first embodiment of the present application.

The technical solutions in the embodiments of the present application will be described in detail below in connection with the drawings in the embodiments of the present application. Obviously, the described embodiments are part of the embodiments of the present application, and not all embodiments. All other embodiments obtained by those skilled in the art without departing from the inventive work of the present application are intended to be within the scope of the present application, based on the embodiments of the application.

The ionization chamber provided by the embodiment of the present application is applied to an ion-implantation apparatus, and the ion-implantation apparatus is a key device before the process of manufacturing an integrated circuit. The ion implantation is a technique for doping a region near a semiconductor surface; the purpose is to change the carrier concentration and conduction type of the semiconductor. Ion implantation Compared with conventional thermal doping process, the ion implantation can perform precise control of injection dosing, injection angle, injection depth, and lateral diffusion and so on, which can overcome the limitation of conventional process and improve the integration level, opening speed, yield rate, and life of the circuit, furthermore, reducing costs and power consumption. Ion implantation apparatus is widely used in doping process, which could meet the requirements of shallow junction, low temperature and precise control, has become an essential device among the integrated circuit manufacturing process. Furthermore, the ionization chamber and the ion-implantation apparatus provided in the present embodiment can be applied to the processes of the low-temperature polysilicon thin film transistor and the organic light emitting diode of the display device, i.e., implanting the plasma on the glass substrate surface.

Please refer to FIGS. 1-4, the filament 100 provided in the first embodiment of the present application comprises a first end portion 10, a second end portion 20 and a connecting portion 30. The connecting portion 30 is located between the first end portion 10 and the second end portion 20 and connects the first end portion 10 and the second end portion 20. The first end portion 10 and the second end portion 20 are electrically connected to a power supply device. In one embodiment, the first end portion 10 is provided with a connector at one end away from the connection portion 30 for connecting to the power supply device, the second end portion 20 is also provided with a connector at one end away from the connection portion 30 for connecting to the power supply device, for accessing the power supply device. The filament 100 and the power supply device are connected in series. The power supply device inputs a current to the filament 100 to generate hot electrons. The first end portion 10 is bent with respect to the second end portion 20 through the connecting portion 30. Specifically, the first end portion 10 and the second end portion 20 are bent symmetrically. In one hand, the bent filament 100 can save the volume of the filament 100; on the other hand, the concentration of plasma generated in the unit space can be improved. Furthermore, the cross-sectional dimension of the bent connecting portion 30 is the same as that of the first end portion 10 and the second end portion 20, that is, the cross-sectional dimensions of the respective portions of the filament 100 are the same, and the cross-sectioning dimension of the filament 100 is uniform in size. In one preferred embodiment, the cross-sectional dimension of the filament is circular shape, and in other embodiments, the cross-sectional dimension of the filament 100 may be elliptical, rectangular, or the like.

Figure 2:
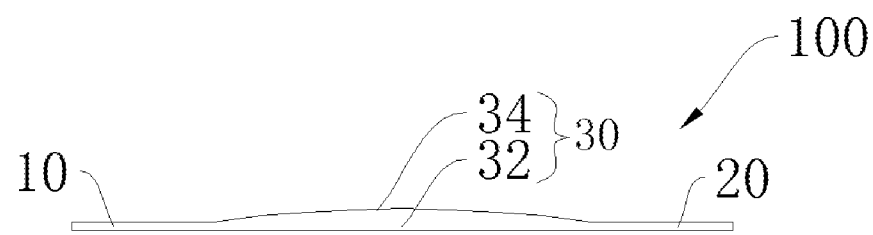
Figure 3:
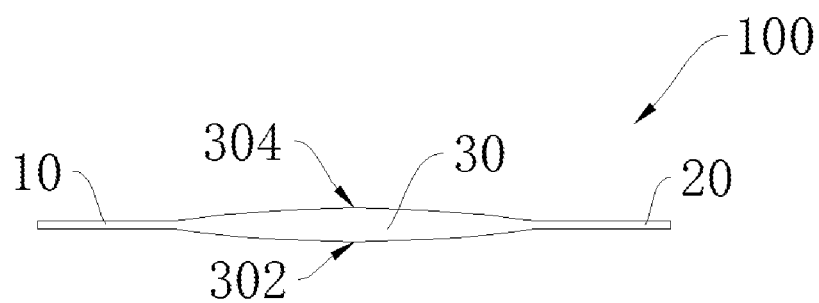
Figure 4:
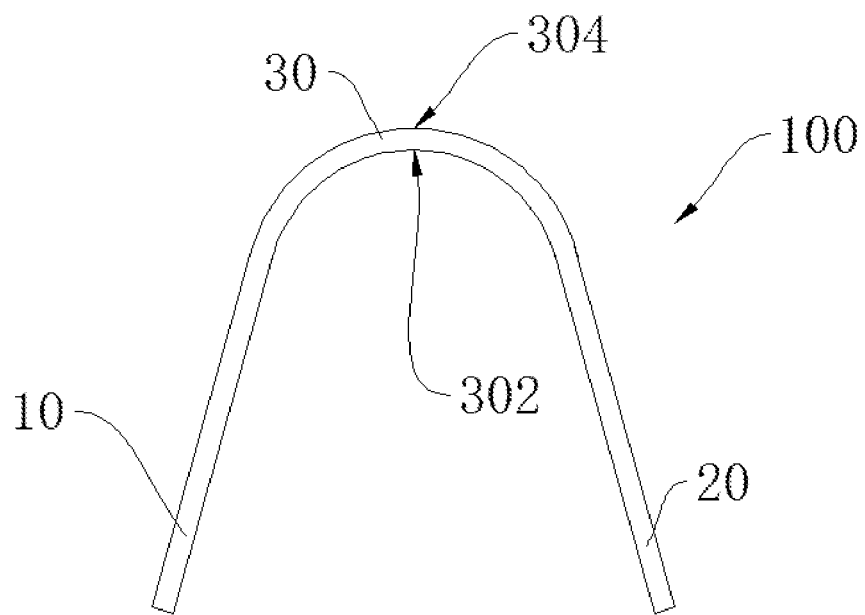
FIG. 4 is a schematic view showing the structure of the filament after bending according to the first embodiment of the present application.

In the embodiment, the cross-sectional dimension of the connecting portion 30 is larger than the cross-sectional dimensions of the first end portion 10 and the second end portion 20 before the filament 100 is bent. Specifically, before bending, the cross-sectional dimension of the first end portion 10 and the cross-sectional dimension of the second end portion 20 are the same, and the connecting portion 30 comprises a main body portion 32 and a protrusion portion 34. The main body portion 32 is connected between the first end portion 10 and the second end portion 20. The cross-sectional dimension of the main body portion 32 is the same as the cross-sectional dimensions of the first end portion 10 and the second end portion 20. The protrusion portion 34 is protruded from a surface of the main body portion 32 in a direction of the cross-sectional dimension. Since the cross-sectional dimension of the protrusion portion 34 increases the cross-sectional dimension of the connecting portion 30, the cross-sectional dimension of the connecting portion 30 is larger than the cross-sectional dimensions of the first end portion 10 and the second end portion 20, a margin (i.e., the cross-sectional dimension of the protrusion portion 34) between the connecting portion 30 with the first end portion 10 and the cross-sectional dimension of the second end portion 20 can compensate a compression caused by bending the connecting portion 30, making the cross-sectional dimension of the bent connecting portion 30 is equal to the cross-sectional dimensions of the first end portion 10 and the second end portion 20. Furthermore, the connecting portion 30 comprises a first side and second side oppositely, the first end portion 10 and the second end portion 20 are bent oppositely to the first side, i.e., the first side is a portion where the connecting portion 30 is compressed at bending, the second side is a portion where the connecting portion 30 is stretched at bending, and the protrusion portion 34 may be located on the first side (as shown in FIG. 1) or may be located on the second side (as shown in FIG. 2), Or the protrusion portion 34 is provided on both of the first side and the second side (as shown in FIG. 3).

The connecting portion 30 is a bent portion of the filament 100, and the cross-sectional dimensions of the respective portions (the first end portion 10, the second end portion 20 and the connecting portion 30) after the filament 100 is bent are the same. Because the resistance of the filament 100 is related with the cross-sectional dimension of the filament 100, the cross-sectional dimension of the filament 100 is uniform, the resistance of respective portions of the filament 100 is the same, the number of the hot electrons generated at respective portions by powering the filament 100 is the same, the hot electrons and ion-source gas collide to generated plasma, the plasma concentration around the filament 100 is uniform, to avoid the emergence of corrosion of the filament 100 at certain portion caused by an over high plasma concentration, hence, the filament 100 is not easy to break, the filament 100 life is improved, the ion-implantation apparatus maintenance costs and display equipment production costs are reduced.

In the embodiment, the cross-sectional dimension of the first end portion 10 to the connecting portion 30 is uniformly increased before bending and the cross-sectional dimension of the second end portion 20 to the connecting portion 30 is uniformly increased before bending. Specifically, the protrusion portion 34 comprises a first end 342, a second end 344, and a third end 346 between the first end 342 and the second end 344. The first end 342 is protruded at one end from the main body portion 32 connecting to the one end of the first end portion 10. The second end 344 is protruded at one end of the main body portion 32 connecting to the second end portion 20. The cross-sectional dimensions of the first end 342 to the third end 346 and the cross-sectional dimensions of the second end 344 to the third end 346 are uniformly increased before bending. The cross-sectional dimension of the connecting portion 30 is uniform after bending. Furthermore, the cross-sectional dimension of the connecting portion 30 the cross-sectional dimension of the connecting portion 30 is the maximum among the whole cross-sectional dimension of the connecting portion 30, the cross-sectional dimension of the connecting portion 30 is uniformly reduced toward the first end portion 10; and the cross-sectional dimension changes uniformly. The cross-sectional dimension of the connecting portion 30 is uniformly reduced toward the second end portion 20; and the cross-sectional dimension changes uniformly. Because the closer to a position of a bending center, the larger the shrinking amount of the cross-sectional dimension of the bending portion after bending, the shrinking amount of the cross-sectional dimension of the filament 100 extending from the center of the bending center toward the first end portion 10 and the second end portion 20 is reduced uniformly, the filament with a uniformly change in the cross-sectional dimension can correspondingly compensate the shrinking amount at respective portions while bending, to make the connecting portion 30 has the same cross-sectional dimensions of the first end portion 10 and the second end portion 20. The cross-sectional dimension of the whole filament 100 is uniform, the number of the hot electrons generated at respective portions by powering the filament 100 is the same, the hot electrons and ion-source gas collide to generated plasma, the plasma concentration around the filament 100 is uniform, to avoid the emergence of corrosion of the filament 100 at certain portion caused by an over high plasma concentration, hence, the filament 100 is not easy to break, the filament 100 life is improved, the ion-implantation apparatus maintenance costs and display equipment production costs are reduced.

Figure 5:
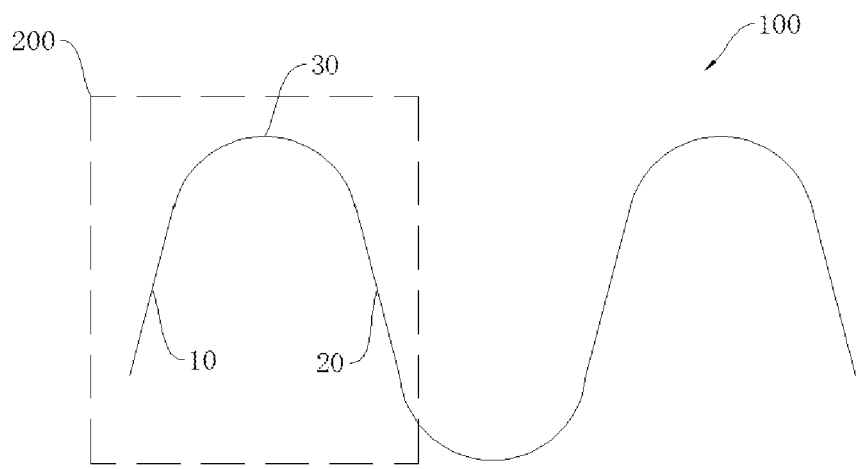
FIG. 5 is a schematic view showing the structure of the filament according to the first embodiment of the present application.

Combining with FIG. 5, in the embodiment, the first end portion 10, the connecting portion 30, and the second end portion 20 are successively connected to form a bending unit 200. The filament 100 comprises a plurality of filament 100 units. The first end portion 10 of each of the filament 100 units is fixedly connected with the second end portion 20 of an adjacent filament 100 unit. The second end portion 20 of each of the filament 100 units is fixedly connected with the first end portion 10 of an adjacent filament 100 unit. Specifically, the plurality of filament 100 units, only the first end 10 and the second end 20 of the filament 100 unit disposed at edges are provided with connectors for access to the power supply device, so that the filament 100 is connected in series with the power supply device. The power supply device inputs current into the filament 100 through the filament 100 to generate hot electrons. Each of the filament 100 units is connected in series with each other, and the power supply device outputs a current to the filament 100 while controlling the current flow through the each filament 100 unit, i.e., the amount of hot electrons generated by each filament 100 unit at the same time. Furthermore, each of the filament 100 units is the same filament 100 unit, that is, each filament 100 unit has the same resistance value, so that the hot electrons generated by each filament 100 units are uniform and the correspondingly generated plasma concentration is uniform. The plurality of bent filament 100 units is connected in series to increase the generating amount of plasma, and the overall size of the filament 100 is also prevented from being too large.

In one embodiment, the connecting portions 30 of adjacent two filament 100 units are bent in opposite directions. Specifically, taking two connecting filament 100 units for example, two of the filament 100 units are referred to as the first filament 100 unit and the second filament 100 unit. The second end portion 20 of the first filament 100 unit is connected to the first end portion 10 of the second filament 100 unit. The bending direction of the first end portion 10 of the first filament 100 is opposite with respect to the second end portion 20 and the bending direction of the second end portion 20 of the second filament 100 is opposite with respect to the first end portion 20, to increase the amount of generation of the plasma and the overall size of the filament 100 is also prevented from being too large.

In the embodiment, the first end portion 10, the second end portion 20, and the connecting portion 30 are integrally molded. Specifically, the filament 100 may be formed by manufacturing into a strip and then bending, and the production method is simple.

In one embodiment, the filament 100 is made of a metallic material. In a preferred embodiment, the filament 100 is a tungsten wire. The cost of metal materials is low and can meet the requirements of generating hot electrons.

The connecting portion 30 is a bent portion of the filament 100, and the cross-sectional dimensions of the respective portions (the first end portion 10, the second end portion 20 and the connecting portion 30) after the filament 100 is bent are the same. Because the resistance of the filament 100 is related with the cross-sectional dimension of the filament 100, the cross-sectional dimension of the filament 100 is uniform, the resistance of respective portions of the filament 100 is the same, the number of the hot electrons generated at respective portions by powering the filament 100 is the same, the hot electrons and ion-source gas collide to generated plasma, the plasma concentration around the filament 100 is uniform, to avoid the emergence of corrosion of the filament 100 at certain portion caused by an over high plasma concentration, hence, the filament 100 is not easy to break, the filament 100 life is improved, the ion-implantation apparatus maintenance costs and display equipment production costs are reduced.

Figure 6:
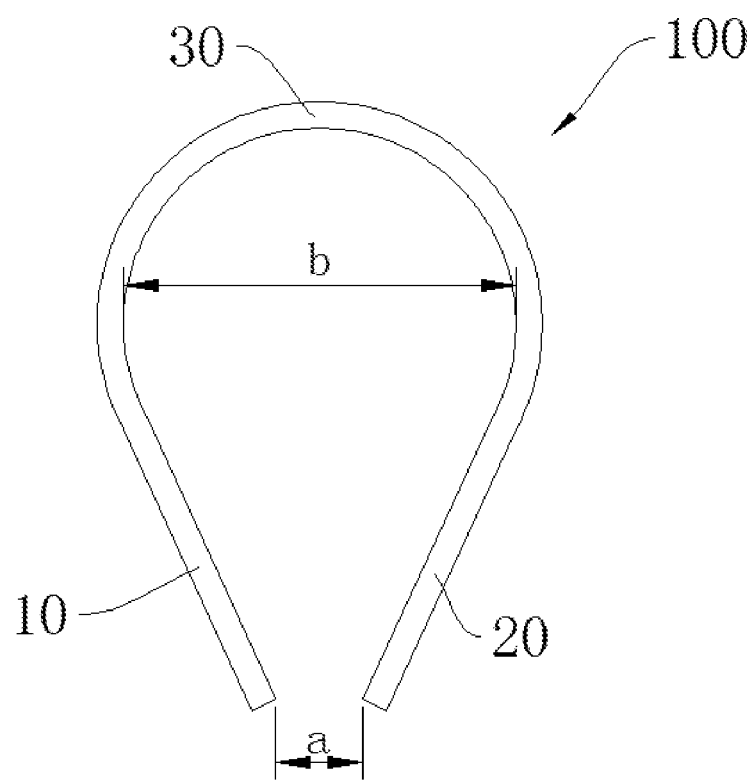
FIGS. 6 and 7 are schematic views showing the structure of the filament after bending according to the second embodiment of the present application.
Figure 7:
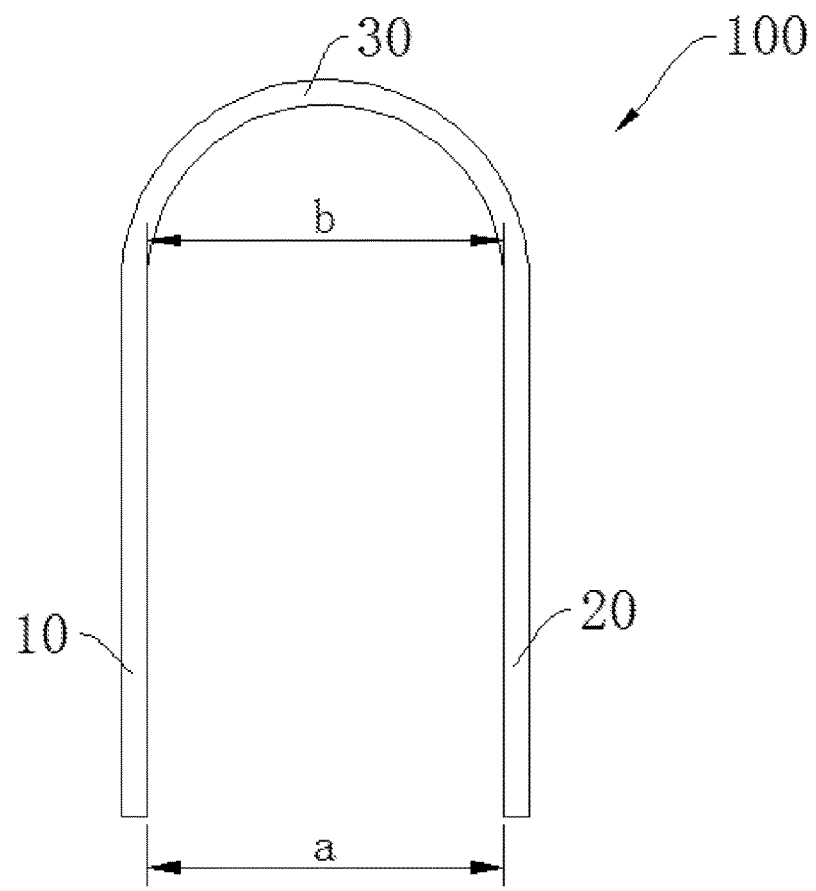

Please refer to FIGS. 6-7, the filament 100 provided in the second embodiment of the present application is bent at the connecting portion 30. A curvature of the connecting portion 30 after bending is not less than π. A distance a between the first end portion 10 and the second end portion 20 is not greater than a bending diameter b (as shown in FIG. 6) of the connecting portion 30. In other embodiments, the distance a between the first end portion 10 and the second end portion 20 is equal to the bending diameter b of the connecting portion 30 (as shown in FIG. 7). The connecting portion 30 is a bent portion of the filament 100, and the cross-sectional dimensions of the respective portions (the first end portion 10, the second end portion 20 and the connecting portion 30) after the filament 100 is bent are the same. Because the resistance of the filament 100 is related with the cross-sectional dimension of the filament 100, the cross-sectional dimension of the filament 100 is uniform, the resistance of respective portions of the filament 100 is the same, the number of the hot electrons generated at respective portions by powering the filament 100 is the same, the hot electrons and ion-source gas collide to generated plasma, the plasma concentration around the filament 100 is uniform, to avoid the emergence of corrosion of the filament 100 at certain portion caused by an over high plasma concentration, hence, the filament 100 is not easy to break, the filament 100 life is improved, the ion-implantation apparatus maintenance costs and display equipment production costs are reduced.

Figure 8:
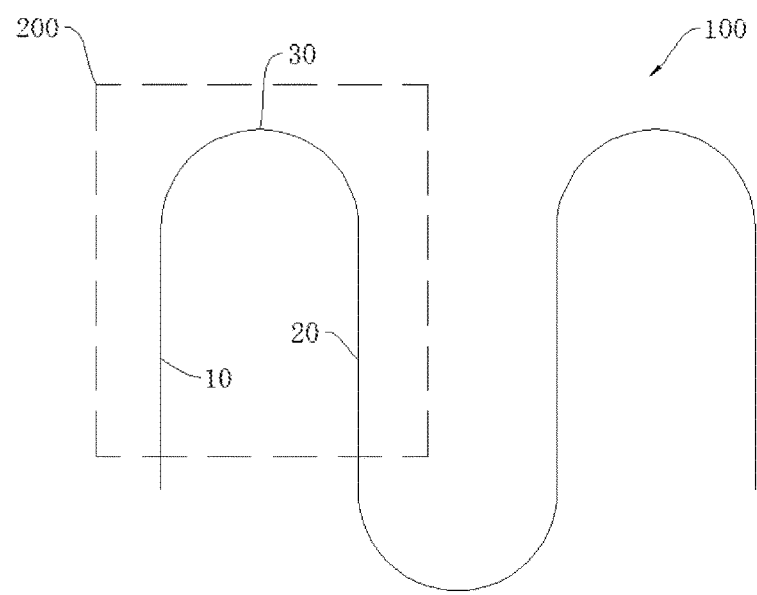
FIG. 8 is a schematic view showing the structure of the filament according to the second embodiment of the present application.
Figure 9:
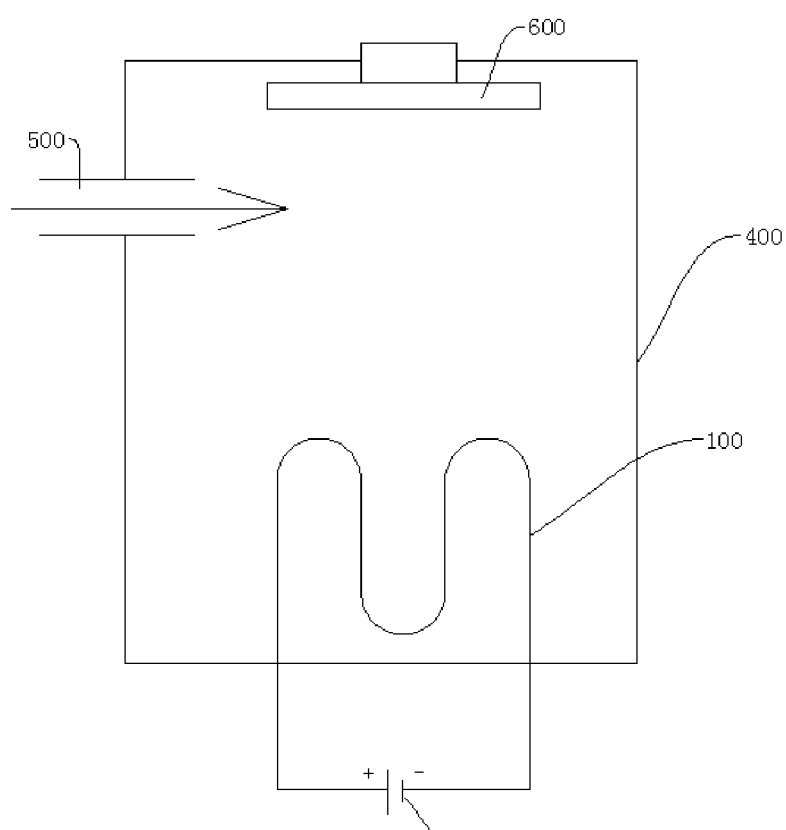
FIG. 9 is a schematic view showing the ionization chamber of the filament according to the embodiment of the present application.

Combining with FIG. 8, in the embodiment, the first end portion 10, the connecting portion 30, and the second end portion 20 are successively connected to form a bending unit 200. The filament 100 comprises a plurality of filament 100 units. The first end portion 10 of each of the filament 100 units is fixedly connected with the second end portion 20 of an adjacent filament 100 unit. The second end portion 20 of each of the filament 100 units is fixedly connected with the first end portion 10 of an adjacent filament 100 unit. Specifically, the plurality of filament 100 units, only the first end 10 and the second end 20 of the filament 100 unit disposed at edges are provided with connectors for access to the power supply device, so that the filament 100 is connected in series with the power supply device. The power supply device inputs current into the filament 100 through the filament 100 to generate hot electrons. Each of the filament 100 units is connected in series with each other, and the power supply device outputs a current to the filament 100 while controlling the current flow through the each filament 100 unit, i.e., the amount of hot electrons generated by each filament 100 unit at the same time. Furthermore, each of the filament 100 units is the same filament 100 unit, that is, each filament 100 unit has the same resistance value, so that the hot electrons generated by each filament 100 units are uniform and the correspondingly generated plasma concentration is uniform. The plurality of bent filament 100 units is connected in series to increase the generating amount of plasma, and the overall size of the filament 100 is also prevented from being too large.

In one embodiment, the connecting portions 30 of adjacent two filament 100 units are bent in opposite directions. Specifically, taking two connecting filament 100 units for example, two of the filament 100 units are referred to as the first filament 100 unit and the second filament 100 unit. The second end portion 20 of the first filament 100 unit is connected to the first end portion 10 of the second filament 100 unit. The bending direction of the first end portion 10 of the first filament 100 is opposite with respect to the second end portion 20 and the bending direction of the second end portion 20 of the second filament 100 is opposite with respect to the first end portion 20, to increase the amount of generation of the plasma and the overall size of the filament 100 is also prevented from being too large.

In the embodiment, the first end portion 10, the second end portion 20, and the connecting portion 30 are integrally molded. Specifically, the filament 100 may be formed by manufacturing into a strip and then bending, and the production method is simple.

In one embodiment, the filament 100 is made of a metallic material. In a preferred embodiment, the filament 100 is a tungsten wire. The cost of metal materials is low and can meet the requirements of generating hot electrons.

The connecting portion 30 is a bent portion of the filament 100, and the cross-sectional dimensions of the respective portions (the first end portion 10, the second end portion 20 and the connecting portion 30) after the filament 100 is bent are the same. Because the resistance of the filament 100 is related with the cross-sectional dimension of the filament 100, the cross-sectional dimension of the filament 100 is uniform, the resistance of respective portions of the filament 100 is the same, the number of the hot electrons generated at respective portions by powering the filament 100 is the same, the hot electrons and ion-source gas collide to generated plasma, the plasma concentration around the filament 100 is uniform, to avoid the emergence of corrosion of the filament 100 at certain portion caused by an over high plasma concentration, hence, the filament 100 is not easy to break, the filament 100 life is improved, the ion-implantation apparatus maintenance costs and display equipment production costs are reduced.

The embodiment of the present application further provides an ionization chamber, as shown in FIG. 7. The ionization chamber provided by the embodiment of the present application is applied to an ion-implantation apparatus comprising a cavity 400, an air supply pipe 500 and the above-mentioned filament 100. The air supply pipe 500 and the filament 100 are disposed in the cavity 400. The filament generates hot electrons while the power supply device 300 supplies current. The air supply pipe 500 is used to output the ion-source gas. The ion-source gas collides with the hot electrons to generate the plasma. Specifically, the cavity 400 is an enclosed space enclosed by a plurality of wall surfaces for providing an environment in which the ion-source gas collides with the hot electrons to generate plasma. The air supply pipe 500 is located in the cavity 400. The air supply pipe 500 communicates with the air supply device supplying the ion-source gas. The gas supply device outputs the ion-source gas into the cavity 400 through the air supply pipe 500. The filament 100 is also disposed within the cavity 400. Specifically, the filament 100 is a wire, and in a preferred embodiment, the filament 100 is a tungsten wire. The air supply tube 500 outputs an ion-source gas to collide with the hot electrons generated by the filament 100 to generate plasma implanted into the substrate 600 to achieve ion implantation.

The connecting portion 30 is a bent portion of the filament 100, and the cross-sectional dimensions of the respective portions (the first end portion 10, the second end portion 20 and the connecting portion 30) after the filament 100 is bent are the same. Because the resistance of the filament 100 is related with the cross-sectional dimension of the filament 100, the cross-sectional dimension of the filament 100 is uniform, the resistance of respective portions of the filament 100 is the same, the number of the hot electrons generated at respective portions by powering the filament 100 is the same, the hot electrons and ion-source gas collide to generated plasma, the plasma concentration around the filament 100 is uniform, to avoid the emergence of corrosion of the filament 100 at certain portion caused by an over high plasma concentration, hence, the filament 100 is not easy to break, the filament 100 life is improved, the ion-implantation apparatus maintenance costs and display equipment production costs are reduced.

The present application also provides an ion-implantation apparatus for implanting plasma into a semiconductor device, and the ion-implantation apparatus comprises the filament 100 described above. The connecting portion 30 is a bent portion of the filament 100, and the cross-sectional dimensions of the respective portions (the first end portion 10, the second end portion 20 and the connecting portion 30) after the filament 100 is bent are the same. Because the resistance of the filament 100 is related with the cross-sectional dimension of the filament 100, the cross-sectional dimension of the filament 100 is uniform, the resistance of respective portions of the filament 100 is the same, the number of the hot electrons generated at respective portions by powering the filament 100 is the same, the hot electrons and ion-source gas collide to generated plasma, the plasma concentration around the filament 100 is uniform, to avoid the emergence of corrosion of the filament 100 at certain portion caused by an over high plasma concentration, hence, the filament 100 is not easy to break, the filament 100 life is improved, the ion-implantation apparatus maintenance costs and display equipment production costs are reduced.

The foregoing is intended only as specific embodiments of the present application, but the scope of protection of the present application is not limited thereto and it will be readily apparent to those skilled in the art that various equivalents may be readily apparent to those skilled in the art, these modifications or substitutions, which should be within the scope of the present application. Accordingly, the scope of protection of the present application is subject to the scope of protection of the claims.

What is claimed is:

1. A filament, applying to an ion implantation apparatus, wherein the filament comprises a first end portion, a second end portion, and a connecting portion between the first end portion and the second end portion, the first end portion and the second end portion are electrically connected to a power supply device, the first end portion is bent with respect to the second end portion through the connecting portion so as to change the connecting portion from a first, unbent state to a second, bent state, wherein the connecting portion has a cross-sectional dimension that is variable and different from cross-sectional dimensions of the first end portion and the second end portion the first state of the connecting portion and the cross-sectional dimension of the connecting portion is the same as the cross-sectional dimensions of the first end portion and the second end portion in the second state of the connecting portion.

2. The filament according to claim 1, wherein the connecting portion comprises a main body portion and a protrusion portion, the main body portion is connected between the first end portion and the second end portion, and a cross-sectional dimension of the main body portion is the same as the cross-sectional dimensions of the first end portion and the second end portion, the protrusion portion is protruded from a surface of the main body portion in a direction of the cross-sectional dimension, a cross-sectional dimension of the connecting portion before bending is larger than the cross-sectional dimensions of the first end portion and the second end portion, the cross-sectional dimension of the connecting portion after bending is equal to the cross-sectional dimensions of the first end portion and the second end portion.

3. The filament according to claim 2, wherein the protrusion portion comprises a first end, a second end, and a third end between the first end and the second end, the first end is protruded at one end from the main body portion connecting to the one end of the first end portion, the second end is protruded at one end of the main body portion connecting to the second end portion, and the cross-sectional dimensions of the first end to the third end and the cross-sectional dimensions of the second end to the third end are uniformly increased before bending, the cross-sectional dimension of the connecting portion is uniform after bending.

4. The filament according to claim 1, wherein a curvature of the connecting portion after bending is not less than π, a distance between the first end portion and the second end portion is not greater than a bending diameter of the connecting portion.

5. The filament according to claim 4, wherein the first end portion, the connecting portion, and the second end portion are successively connected to form a bending unit, the filament comprises a plurality of filament units, the first end portion of each of the filament units is fixedly connected with the second end portion of an adjacent filament unit, the second end portion of each of the filament units is fixedly connected with the first end portion of an adjacent filament unit.

6. The filament according to claim 5, wherein the connecting portions of adjacent two filament units are bent in opposite directions.

7. The filament according to claim 6, wherein the first end portion, the second end portion, and the connecting portion are integrally molded.

8. The filament according to claim 7, wherein the filament is a tungsten wire.

9. An ionization chamber, applying to an ion implantation apparatus, wherein the ionization chamber comprises a cavity, air supply tubes, and filaments, the air supply tubes and the filaments are disposed in the cavity, the filaments are energized to generate hot electrons for outputting an ion-source gas, the ion-source gas collides the hot electrons to produce a plasma, each of the filaments comprises a first end portion, a second end portion, and a connecting portion between the first end portion and the second end portion, the first end portion and the second end portion are electrically connected to a power supply device, the first end portion is bent with respect to the second end portion through the connecting portion so as to change the connecting portion from a first, unbent state to a second, bent state, wherein the connecting portion has a cross-sectional dimension that is variable and different from cross-sectional dimensions of the first end portion and the second end portion the first state of the connecting portion and the cross-sectional dimension of the connecting portion is the same as the cross-sectional dimensions of the first end portion and the second end portion in the second state of the connecting portion.

10. The ionization chamber according to claim 9, wherein the connecting portion comprises a main body portion and a protrusion portion, the main body portion is connected between the first end portion and the second end portion, and a cross-sectional dimension of the main body portion is the same as the cross-sectional dimensions of the first end portion and the second end portion, the protrusion portion is protruded from a surface of the main body portion in a direction of the cross-sectional dimension, a cross-sectional dimension of the connecting portion before bending is larger than the cross-sectional dimensions of the first end portion and the second end portion, the cross-sectional dimension of the connecting portion after bending is equal to the cross-sectional dimensions of the first end portion and the second end portion.

11. The ionization chamber according to claim 10, wherein the protrusion portion comprises a first end, a second end, and a third end between the first end and the second end, the first end is protruded at one end from the main body portion connecting to the one end of the first end portion, the second end is protruded at one end of the main body portion connecting to the second end portion, and the cross-sectional dimensions of the first end to the third end and the cross-sectional dimensions of the second end to the third end are uniformly increased before bending, the cross-sectional dimension of the connecting portion is uniform after bending.

12. The ionization chamber according to claim 9, wherein a curvature of the connecting portion after bending is not less than π, a distance between the first end portion and the second end portion is not greater than a bending diameter of the connecting portion.

13. The ionization chamber according to claim 12, wherein the first end portion, the connecting portion, and the second end portion are successively connected to form a bending unit, the filament comprises a plurality of filament units, the first end portion of each of the filament units is fixedly connected with the second end portion of an adjacent filament unit, the second end portion of each of the filament units is fixedly connected with the first end portion of an adjacent filament unit.

14. The ionization chamber according to claim 13, wherein the connecting portions of adjacent two filament units are bent in opposite directions.

15. The ionization chamber according to claim 14, wherein the first end portion, the second end portion, and the connecting portion are integrally molded.

16. The ionization chamber according to claim 15, wherein the filament is a tungsten wire.

17. The ion implantation apparatus, wherein the ion implantation apparatus comprises filaments, each of the filaments comprises a first end portion, a second end portion, and a connecting portion between the first end portion and the second end portion, the first end portion and the second end portion are electrically connected to a power supply device, the first end portion is bent with respect to the second end portion through the connecting portion so as to change the connecting portion from a first, unbent state to a second, bent state, wherein the connecting portion has a cross-sectional dimension that is variable and different from cross-sectional dimensions of the first end portion and the second end portion the first state of the connecting portion and the cross-sectional dimension of the connecting portion is the same as the cross-sectional dimensions of the first end portion and the second end portion in the second state of the connecting portion.

18. The ion implantation apparatus according to claim 17, wherein the connecting portion comprises a main body portion and a protrusion portion, the main body portion is connected between the first end portion and the second end portion, and a cross-sectional dimension of the main body portion is the same as the cross-sectional dimensions of the first end portion and the second end portion, the protrusion portion is protruded from a surface of the main body portion in a direction of the cross-sectional dimension, a cross-sectional dimension of the connecting portion before bending is larger than the cross-sectional dimensions of the first end portion and the second end portion, the cross-sectional dimension of the connecting portion after bending is equal to the cross-sectional dimensions of the first end portion and the second end portion.

19. The ion implantation apparatus according to claim 18, wherein the protrusion portion comprises a first end, a second end, and a third end between the first end and the second end, the first end is protruded at one end from the main body portion connecting to the one end of the first end portion, the second end is protruded at one end of the main body portion connecting to the second end portion, and the cross-sectional dimensions of the first end to the third end and the cross-sectional dimensions of the second end to the third end are uniformly increased before bending, the cross-sectional dimension of the connecting portion is uniform after bending.

20. The ion implantation apparatus according to claim 17, wherein a curvature of the connecting portion after bending is not less than 7C, a distance between the first end portion and the second end portion is not greater than a bending diameter of the connecting portion.

* * * * *